United States Patent
Schiffer

(10) Patent No.: US 11,223,082 B2
(45) Date of Patent: Jan. 11, 2022

(54) THERMOCOUPLE, BONDING TOOL FOR THERMOCOUPLE, BATTERY MODULE, METHOD FOR MANUFACTURING THERMOCOUPLE, AND METHOD FOR BONDING THERMOCOUPLE

(71) Applicant: Samsung SDI Co., Ltd., Yongin-si (KR)

(72) Inventor: Adrian Schiffer, Vienna (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 16/770,210

(22) PCT Filed: Jan. 10, 2019

(86) PCT No.: PCT/KR2019/000415
§ 371 (c)(1),
(2) Date: Jun. 5, 2020

(87) PCT Pub. No.: WO2019/143067
PCT Pub. Date: Jul. 25, 2019

(65) Prior Publication Data
US 2020/0295420 A1    Sep. 17, 2020

(30) Foreign Application Priority Data

Jan. 18, 2018 (EP) .................................. 18152264

(51) Int. Cl.
*H01M 10/6572* (2014.01)
*G01K 1/143* (2021.01)
(Continued)

(52) U.S. Cl.
CPC ........ *H01M 10/6572* (2015.04); *G01K 1/143* (2013.01); *G01K 7/04* (2013.01);
(Continued)

(58) Field of Classification Search
None
See application file for complete search history.

(56) References Cited

U.S. PATENT DOCUMENTS 3,713,899 A * 1/1973 Sebestyen ................ G01K 7/04
                                                        136/233
3,816,182 A * 6/1974 McAdam ................. G01K 7/04
                                                        136/230
(Continued)

FOREIGN PATENT DOCUMENTS

CN     102820236 A    12/2012
CN     103178314 A     6/2013
(Continued)

OTHER PUBLICATIONS

Author Unknown, MECH-EL/MEI 909 Product Information Sheet, accessed at http://www.mech-el.com/909.htm on Apr. 22, 2021 and archived to Mar. 18, 2011. (Year: 2011).*

(Continued)

*Primary Examiner* — Eli S Mekhlin
(74) *Attorney, Agent, or Firm* — Lewis Roca Rothgerber Christie LLP

(57) ABSTRACT

A thermocouple for temperature measurement according to an embodiment may include a first wire of a first metallic material and a second wire of a second metallic material different from the first metallic material, a first section in which the first wire and the second wire are electrically insulated from each other, a second section in which the first wire and the second wire are connected to each other to form a measuring junction, a first layer of a thermally conductive and electrically insulating first material enclosing the second section, and a second layer of an ultrasonic-weldable second material enclosing at least part of the first layer.

16 Claims, 6 Drawing Sheets

(51) Int. Cl.
　　　*G01K 7/04*　　　(2006.01)
　　　*H01L 35/24*　　　(2006.01)
　　　*H01L 35/32*　　　(2006.01)
　　　*H01L 35/34*　　　(2006.01)
　　　*H01M 10/48*　　　(2006.01)

(52) U.S. Cl.
　　　CPC .............. *H01L 35/24* (2013.01); *H01L 35/32* (2013.01); *H01L 35/34* (2013.01); *H01M 10/482* (2013.01); *H01M 10/486* (2013.01)

(56) References Cited

U.S. PATENT DOCUMENTS

| | | | |
|---|---|---|---|
| 3,939,554 A | | 2/1976 | Finney |
| 4,057,845 A | * | 11/1977 | Ejiri .................. G06K 9/03 382/149 |
| 4,243,402 A | * | 1/1981 | Sensi .................. C03B 18/18 136/232 |
| 4,338,479 A | | 7/1982 | Bauman |
| 4,477,687 A | * | 10/1984 | Finney .................. G01K 1/143 136/201 |
| 4,659,898 A | | 4/1987 | Spiegelman et al. |
| 4,729,154 A | * | 3/1988 | Gilbert .................. F16C 33/303 29/898.062 |
| 4,818,895 A | | 4/1989 | Kaufman |
| 4,934,831 A | * | 6/1990 | Volbrecht .................. G01K 1/08 29/612 |
| 5,141,335 A | | 8/1992 | Wannamaker et al. |
| 5,161,297 A | * | 11/1992 | Ruhl .................. C23C 18/04 205/680 |
| 2007/0251938 A1 | | 11/2007 | Lin et al. |
| 2010/0101553 A1 | * | 4/2010 | Dotti .................. G01K 1/143 126/58 |
| 2010/0172392 A1 | | 7/2010 | Katzenberger et al. |
| 2011/0136334 A1 | | 6/2011 | Ryu et al. |
| 2014/0318591 A1 | * | 10/2014 | Shelby .................. H01L 35/32 136/225 |
| 2015/0318582 A1 | * | 11/2015 | Brockman .......... H01M 10/425 320/137 |
| 2016/0315359 A1 | * | 10/2016 | Tyler .................. H01M 50/502 |

FOREIGN PATENT DOCUMENTS

| | | |
|---|---|---|
| GB | 2 128 743 A | 5/1984 |
| JP | 6-91133 A | 4/1994 |
| JP | 2009-174889 A | 8/2009 |
| JP | 5371742 B2 | 12/2013 |
| KR | 10-1133886 B1 | 4/2012 |
| KR | 10-2015-0075697 A | 7/2015 |
| KR | 10-1610827 B1 | 4/2016 |
| WO | WO 2009/055944 A1 | 5/2009 |

OTHER PUBLICATIONS

Extended European Search Report for European Patent Application Np. 18152264.0, dated Jul. 3, 2018, 8pp.

Chinese Office action issued in corresponding application No. CN 201980008496.8, dated Jun. 9, 2021, 16 pages (with English Translation).

* cited by examiner (A)  (B)  (C)

RELATED ART

[FIG. 3]
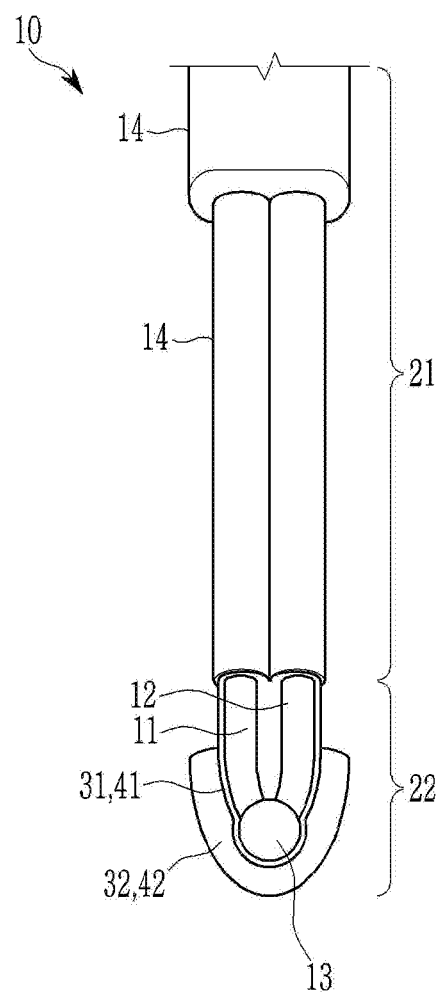

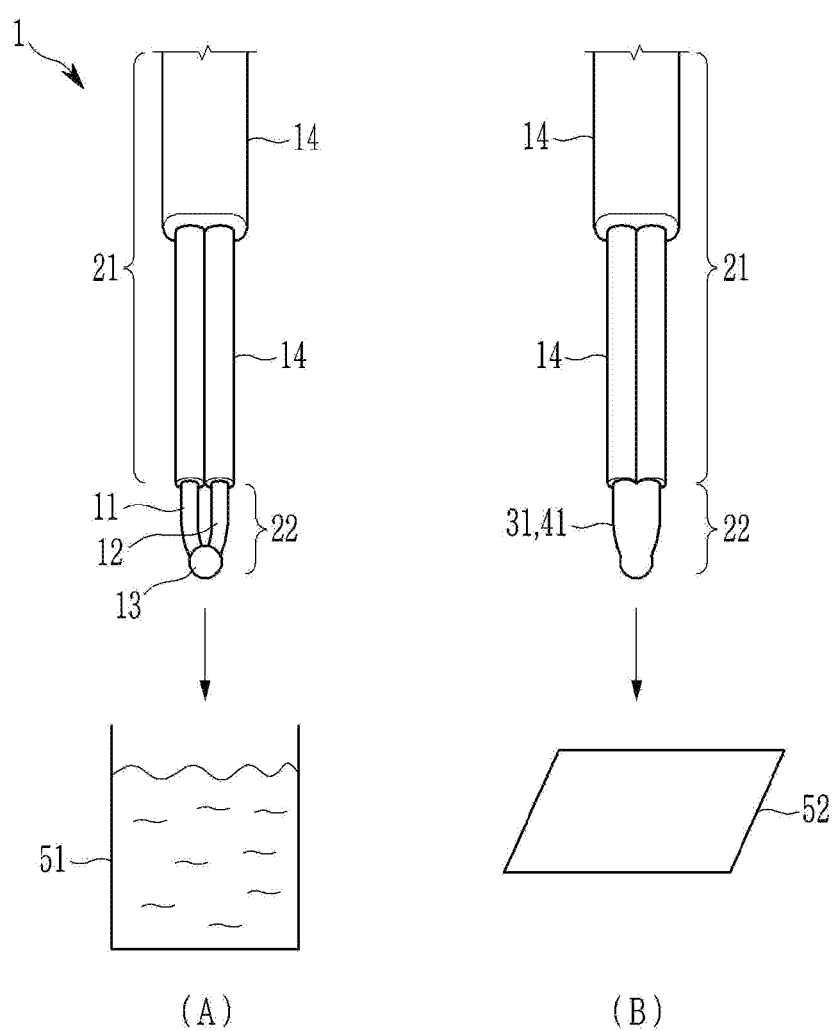
[FIG. 4]

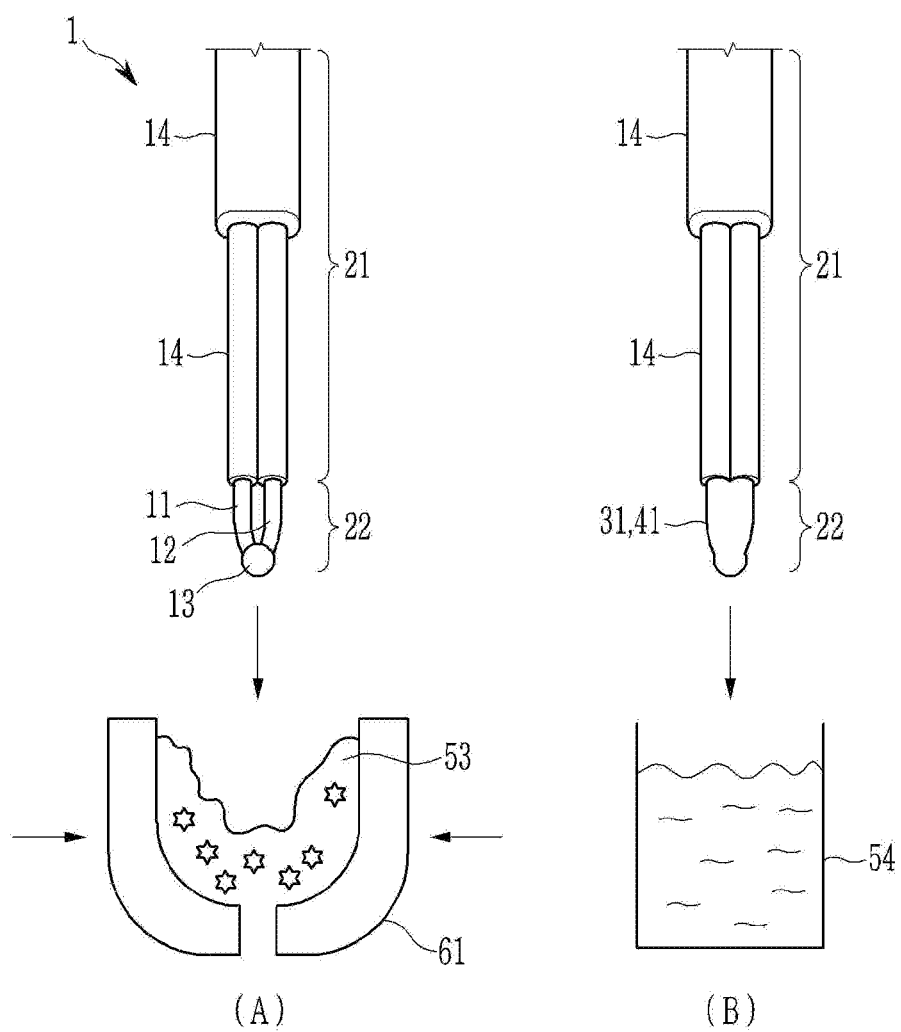
[FIG. 5]

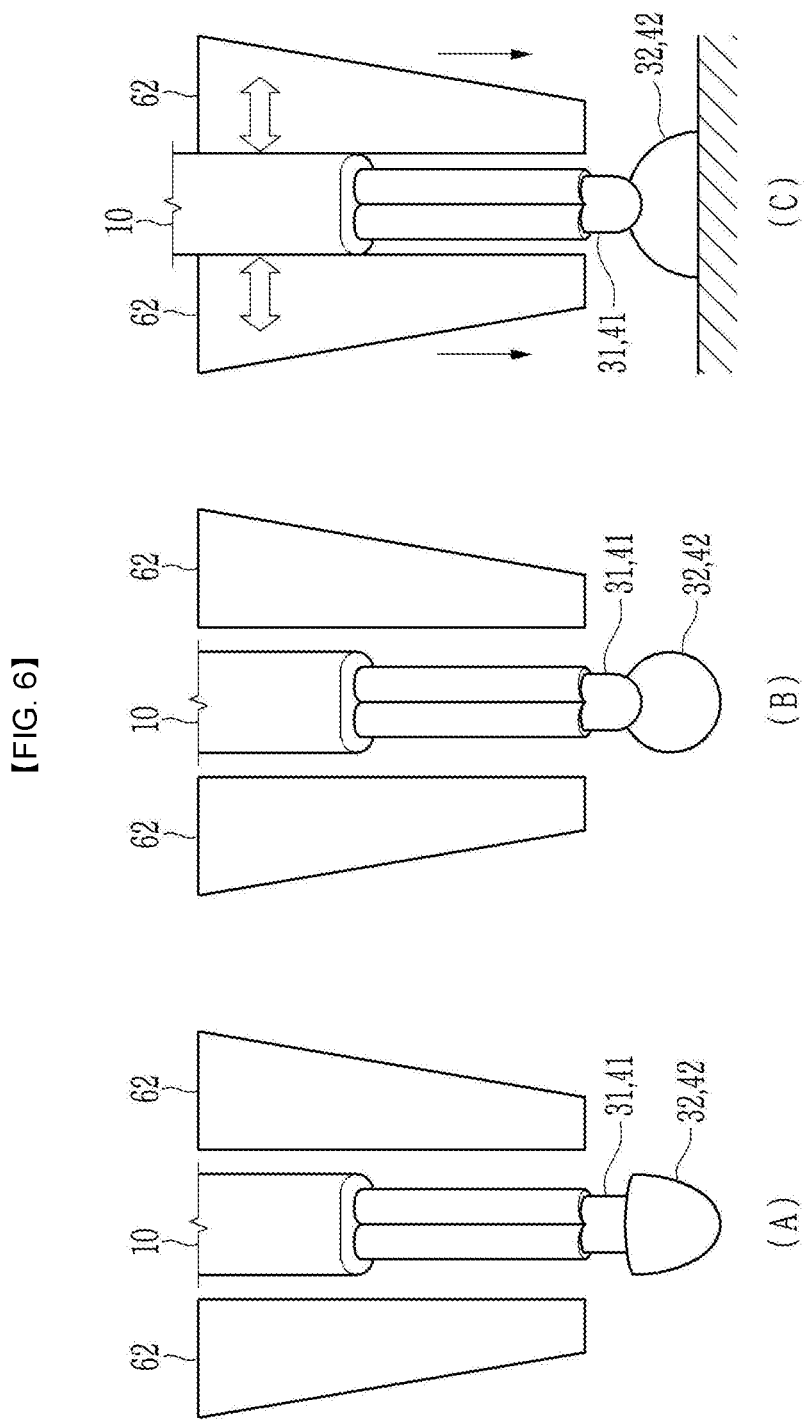
[FIG. 6]

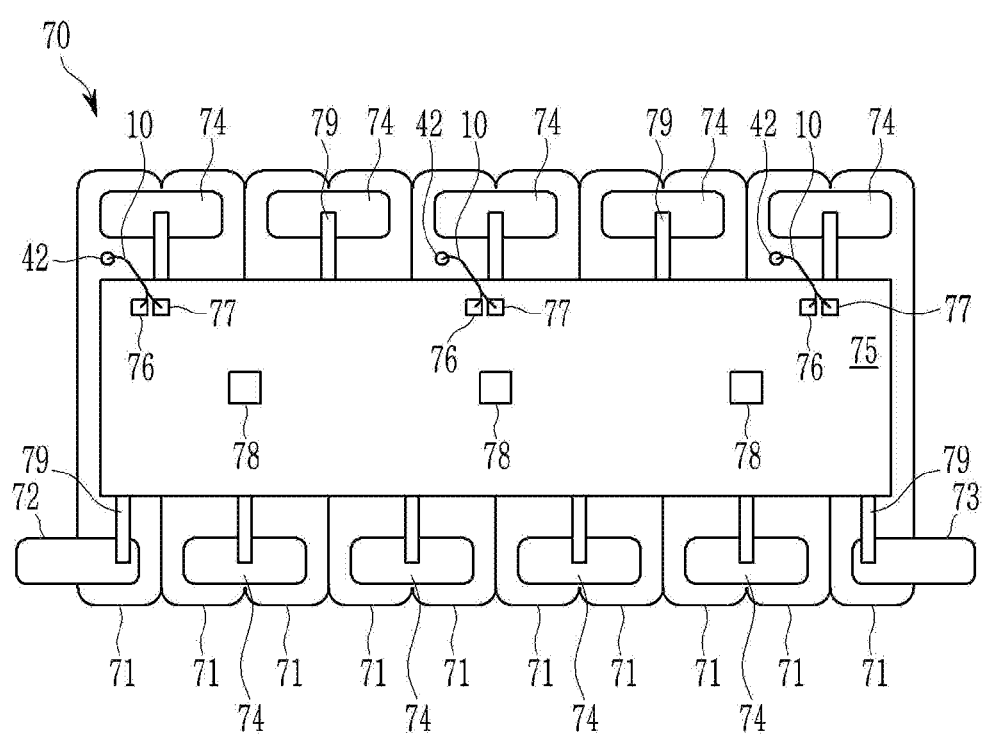
【FIG. 7】

THERMOCOUPLE, BONDING TOOL FOR THERMOCOUPLE, BATTERY MODULE, METHOD FOR MANUFACTURING THERMOCOUPLE, AND METHOD FOR BONDING THERMOCOUPLE

CROSS-REFERENCE TO RELATED APPLICATION(S)

This application is a National Phase Patent Application of International Patent Application Number PCT/KR2019/000415, filed on Jan. 10, 2019, which claims priority of European Patent Application No. 18152264.0, filed Jan. 18, 2018. The entire contents of all of which are incorporated herein by reference.

TECHNICAL FIELD

An embodiment relates to a thermocouple, a bonding tool for a thermocouple, a battery module, a method for manufacturing a thermocouple, and a method for bonding a thermocouple.

BACKGROUND ART

A rechargeable or secondary battery differs from a primary battery in that it can be repeatedly charged and discharged, while the latter provides only an irreversible conversion of chemical to electrical energy. Low-capacity rechargeable batteries are used as a power supply for small electronic devices, such as cellular phones, notebook computers, and camcorders, while high-capacity rechargeable batteries are used as the power supply for hybrid vehicles and the like.

In general, rechargeable batteries include an electrode assembly including a positive electrode, a negative electrode, and a separator interposed between the positive and negative electrodes, a case receiving the electrode assembly, and an electrode terminal electrically connected to the electrode assembly. An electrolyte solution is injected into the case in order to enable charging and discharging of the battery via an electrochemical reaction of the positive electrode, the negative electrode, and the electrolyte solution. The shape of the case, e.g. cylindrical or rectangular, depends on the battery's intended purpose.

Rechargeable batteries may be used as a battery module formed of a plurality of unit battery cells coupled in series and/or in parallel so as to provide a high energy density, e.g. for motor driving of a hybrid vehicle. That is, the battery module is formed by interconnecting the electrode terminals of the plurality of unit battery cells depending on a required amount of power and in order to realize a high-power rechargeable battery, e.g. for an electric vehicle. Battery modules can be constructed either in block design or in modular design. In block design, each battery cell is coupled to a common current collector structure and a common battery management system. In modular designs, pluralities of battery cells are connected to form submodules and several submodules are connected to form the battery module. Battery management functions may be realized either on a module or submodule level, and thus interchangeability of the components is improved. One or more battery modules are mechanically and electrically integrated, equipped with a thermal management system, and set up for communication with electrical consumers in order to form a battery system.

For meeting the dynamic power demands of various electrical consumers connected to the battery system, static control of battery power output and charging is not sufficient. Thus, steady exchange of information between the battery system and the controllers of the electrical consumers is required. This information includes the actual state of charge (SoC) of the battery system, potential electrical performance, charging ability, and internal resistance, as well as actual or predicted power demands or surpluses of consumers. Battery systems usually include a battery management system (BMS) for processing this information.

One significant parameter related to the state of a battery cell or module is the battery cell (module) temperature. Therefore, temperature sensitive elements (sensors) are provided within the battery module, and signals provided by such sensors are then considered in controlling the battery module and/or in controlling a thermal management system. A variety of temperature sensors providing an electronic temperature dependent signal, such as, e.g., thermistor-based or thermocouple-based temperature sensors, can be used in battery modules. Utilized temperature sensors usually include a measurement probe that has to be brought into thermal contact with a target surface of a battery cell and/or module. Therefor a spring-loaded measurement probe for a PTC-based sensor, or thermowells for a thermocouple-based sensor, have been used as the measurement probe. Thermowell-based solutions for thermocouples may lead to slow temperature sensing due to delayed heat transfer.

The structure of a thermocouple usually depends on the temperature range to be sensed and the environmental conditions the thermocouple is exposed to. In industrial applications, sheathed thermocouples are often used, where wires are embedded in ceramic insulation with a stainless steel or nickel alloy sheath enclosing the ceramic matrix. Sheathed thermocouples can be brought in contact with a target surface by using a thermowell, or if the measuring junction is ungrounded, by welding the sheath material to the target surface. Further, weldable connectors exist for bringing thermocouples into thermal contact with a target surface. The prior arts with respect to thermally connecting a thermocouple measuring junction to a target surface are described in U.S. Pat. Nos. 4,659,898, 3,939,554, and U.S. Pat. No. 5,141,335.

Meanwhile, the sheathed thermocouples usually applied in industrial applications are rather rigid, such that the connections, particularly welding connections, to the target surface are prone to damage and detachment from the target surface. This may have an adverse effect of the thermal measurements obtained by the thermocouple, which are strongly correlated to the quality of the junction's bond to the target.

In automotive applications, where strong vibrations and impacts are likely to occur during the operation of the thermocouple, it is thus desired to use more elastic thermocouples. For example, it is suitable to use basic thermocouples that consist mainly of an elastic wire pair with an exposed junction as illustrated in FIG. 1. However, so far these basic thermocouples had to be soldered by hand to the target surface and their application was thus mainly restricted to science or to prototype construction.

DISCLOSURE

Technical Problem

An embodiment of the present invention has been made in an effort to provide an improved thermocouple and a bonding method for such improved thermocouple that can be used on an industrial scale and allows for a long-term stable connection to a target surface even under prolonged vibrations and impacts.

Technical Solution

According to a first aspect of the present invention for solving the above problems, a thermocouple for temperature measurement is provided that includes a first wire of a first metallic material and a second wire of a second metallic material different from the first metallic material. The thermocouple includes a first section and a second section in a lengthwise direction of the thermocouple. The first section of the thermocouple may be formed to bend elastically across the whole length of the first section. Further, in the first section, the first and second wires are electrically insulated from each other. In the second section of the thermocouple, the first wire and the second wire are connected to each other to form a measuring junction. The connection of the first and second wires may be a welded connection but other connection types are possible as well, and the first and second wires may even be twisted.

A first layer of a thermally conductive and electrically insulating first material may enclose at least a part of the second section. The first layer of the first material may surround (coat) at least the measuring junction, and the first material may surround the entire second section of the thermocouple. Further, a second layer of an ultrasonic-weldable second material may surround at least a part of the first layer. The second material may be formed to surround (coat) at least the whole embedded measuring junction, and may be different from the first material.

The thermocouple may advantageously be used in a wire-bonding apparatus according to an embodiment. Therein, a weld connection between the thermocouple and a target surface may be established by ultrasonic welding the second material to the target surface using the wire-bonding apparatus. In the welding process, the first layer of the first material can electrically insulate the measuring junction from the second material and the target surface. The wire-bonding apparatus may be used for bonding the thermocouple to the target surface with only minor modifications carried out to a capillary tool of the existing wire bonding apparatus and by replacing a wire coil with a magazine for hosting at least one thermocouple.

According to an embodiment, by bonding the thermocouple to the target surface using the wire bonding apparatus, a well-defined thermal contact may be replicably established between the measuring junction and the target surface. As the quality of the thermal contact strongly influences the measurements of the thermocouple, reliable measurement results can be obtained with the thermocouple providing good thermal contact.

Further, due to the elasticity of the first section, the thermocouple may be loaded into and applied, guided, and positioned by the wire-bond apparatus without a risk of breaking its wires or damaging a welded connection. Also, after establishing a weld connection via the second material, the free ends (hereinafter referred to as "second ends") of the first and second wires may be welded to respective contact pads via the wire-bonding machine. Hence, with the thermocouple, a fully automated setup of a thermocouple temperature sensor can be achievable.

The thermocouple may be formed as a basic elastic thermocouple (hereinafter referred to as a "basic thermocouple"). Therein, the first section of the basic thermocouple includes a pair of different wires, insulated with insulating materials (e.g. standard plastic cable insulation materials), and the second section of the basic thermocouple includes an exposed section of the pair of wires, wherein the pair of wires are connected to each other, e.g. by welding, to form the measuring junction. The thermocouple is obtained by exclusively coating the second section of the basic thermocouple with the first material, and subsequently, with the second material. Since the manufacturing cost of the basic thermocouple is low, the thermocouple can be manufactured in a cost-effective way, which further benefits the mass production of the thermocouple.

The first and second wires of the thermocouple may form one of a nickel-alloy thermocouple (Type E, J, K, M, N, or T), a platinum/rhodium-alloy thermocouple (Type B, R, or S), a tungsten/rhenium-alloy thermocouple (Type C, D, or G), a chromel-gold/iron-alloy thermocouple, a noble-metal alloy thermocouple (Type P), a platinum/molybdenum-alloy thermocouple, a iridium/rhodium alloy thermocouple, a pure noble-metal (Au—Pt, Pt—Pd) thermocouple, or a skutterudite thermocouple. Materials forming the thermocouple may be selected according to the temperature range of interest, and with respect to the coating of the first and second materials, and material parameters of the first and second materials.

The length of the first section may exceed the length of the second section in a length direction of the thermocouple. The length of the first section may be at least 5 times or more (e.g. 10 times, 15 times, 20 times, 25 times, etc.) of the length of the second section. Because of this, sufficient elasticity of the overall thermocouple is provided and the applicability of the thermocouple to the wire-bonding apparatus is ensured.

A layer thickness of the first layer may be 0.5 mm to 5 mm, 0.1 mm to 3 mm, or 0.1 mm to 1 mm. Such layer thickness of the first layer may be formed within a range that enables electrical insulation of the measuring junction without significantly decreasing thermal conduction between the measuring junction and the target surface.

A layer thickness of the second layer may be 50 μm to 1 mm, 50 μm to 500 μm, or 100 μm to 500 μm. Such layer thickness may be formed to be sufficient for manufacturing a reliable and replicable weld connection, e.g., a wedge bond or a ball bond, between the measuring junction and the target surface using the wire-bonding apparatus. The low layer thickness of the second layer further contributes to a cost-effective production process.

Both of the first wire and the second wire may have an overall diameter of 150 μm to 3.5 mm, 300 μm to 2 mm, or 500 μm to 1 mm, respectively. The thermocouple may have an overall diameter between 300 μm and 14 mm, between 400 μm and 10 mm, or between 500 μm and 3 mm. As the wires and the thermocouple do not necessarily have a circular cross-section, the overall diameter refers to the largest linear extension of cross-sections deviating from a circle. Low overall diameters of the wires and of the thermocouple allow for the use of wire-bonding apparatuses that are widely available for commercial applications and with the need for only minimal modifications to be applied thereto.

The first material is a plastic material, and may be at least one of polyethylene, polyimide, polyamide, polybutylene terephthalate, polypropylene, polyether ether ketone, epoxy resin, and polyphenylene sulfide. These materials provide sufficient electrical insulation and at the same time satisfactory thermal conductivity. Further, these materials may be provided in a variety of solid states and hence allow for an uncomplicated application process. In particular, polyimide provides thermal stability and good thermal conductivity in a wide temperature range. The first material may include thermally conductive fillers, such as graphite, carbon, sapphire, metal, or ceramic particles. The first material may also be a ceramic compound with high thermal stability. The first material may also be a magnesium oxide. The use of a temperature stable ceramic compound as the first material allows for applying the second material from a melt.

The second material may include an alloy of at least one of gold, copper, and aluminum. These materials are standard materials for wire-bonding applications and thus may provide high reliability in providing a weld connection by ultrasonic welding using the wire-bonding apparatus. Other materials capable of ultrasonic welding and providing sufficient thermal conductivity, such as plastic materials, may be used as the second material. The second material may be the same material as the material of a target surface in order to provide an improved substance-to-substance bond via the weld.

The first wire and the second wire of the thermocouple may have different lengths. Hence, the thermocouple may have a basic Y-shape with different lengths of the two top legs. The measuring junction may be provided by connecting a first end of the first wire and a first end of the second wire, e.g. via a weld connection. By providing the first and second wires with different lengths, the remaining second ends of the first wire and second wire may be separately attached to respective contact pads of a circuit carrier with the wire-bonding apparatus in a consecutive manner, e.g., with a ball or wedge bond.

According to a second aspect of the present invention, a method for manufacturing the thermocouple for temperature measurement is provided. The method for manufacturing the thermocouple may include: providing a basic thermocouple with a first wire of a first metallic material, a second wire of a second metallic material different from the first metallic material, a first section formed to bend elastically and in which the first wire and the second wire are electrically insulated from each other, and a second section in which the first wire and the second wire are exposed and connected to each other to form a measuring junction; embedding the second section in the first layer of a thermally conductive and electrically insulating first material; and embedding at least part of the first layer in the second layer of an ultrasonic-weldable second material.

The method for manufacturing the thermocouple may further include providing the basic thermocouple, and the providing the basic thermocouple may include producing the basic thermocouple or obtaining a freely available basic thermocouple that includes the further features described above.

The basic thermocouple includes or consists of an insulated pair of wires forming the thermocouple, where, in the second section of the basic thermocouple, the insulation of the pair of wires is removed and the pair of wires are connected to each other and form the measuring junction. The basic thermocouple may bend elastically at least within the first section, e.g., within the whole first section. The method for manufacturing the thermocouple may include a two-step coating process of the measuring junction with, first, an insulating but thermally conductive material, and second, an ultrasonic weldable material. The thermocouple produced in the method for manufacturing the thermocouple can be advantageously applied using the wire-bonding apparatus.

The first material and the second material are applied exclusively to the second section, particularly exclusively to the measuring junction, so that material costs and processing time can be reduced. In the first section, at least one of the first wire and the second wire may be enclosed by a plastic cable insulation material. Further, both of the first and second wires insulated by the plastic cable insulating material may be additionally enclosed by another plastic cable insulation material.

In the method for manufacturing the thermocouple, the first material is a plastic material and may be at least one of polyethylene, polyimide, polyamide, polybutylene terephthalate, polypropylene, polyether ether ketone, epoxy resin, or polyphenylene sulfide. In the method for manufacturing the thermocouple, the embedding the second section in the first layer may include embedding the second section in the first layer of the first material by immersing the second section in a melt or solution of the first material. In other words, the embedding the second section in the first layer may include immersing the second section or the measuring junction of the basic thermocouple in the melt or the solution of the first material, and, after immersing the second section or the measuring junction in the melt or the solution, forming the first layer of the first material via evaporation of a solvent or solidification of the adhered melt. In the embedding the second section in the first layer, the plastic material forming the first material is polyimide, and the melt or the solution of the first material may include a thermally conductive filler.

In the method for manufacturing the thermocouple, the embedding at least part of the first layer in the second layer of the second material may include, after forming the first layer of the first material, embedding the at least part of the first layer in the second material by wrapping a thin foil of the second material around a tip of the second section. The thin foil of the second material may be provided with a thickness 50 µm to 1 mm, 50 µm to 500 µm, or 100 µm to 500 µm. The thin foil is provided with a surface area corresponding at least roughly to the surface area of the second section embedded in the first material. Therein, the surface area of the thin foil refers to the surface area of a single side of the foil. The wrapping of the thin foil around the embedded second section or measuring junction may be performed by movably holding an edge section of the thin foil and guiding the tip of the embedded second section or measuring junction toward and into the foil such that the foil lays around the second section. The wrapping of the thin foil around the embedded second section may be performed by a microscopic version of a deep drawing process. The wrapping of the thin foil around the embedded second section may be performed by a wrapping tool as utilized in packaging machines of the food industry.

In the method for manufacturing the thermocouple, the first material may be a ceramic compound with high thermal stability. For example, the first material may be a magnesium oxide. In the method for manufacturing the thermocouple, the embedding the second section in the first layer includes inserting a ceramic compound powder, e.g., a magnesium oxide powder, and the second section, into a mold. Before the embedding the second section in the first layer, grinding the ceramic compound powder to a grain size and grain form that are suitable for allowing to solidify the ceramic compound powder by compacting may be additionally performed. Further, the embedding the second section in the first layer may include compressing and molding the ceramic compound powder around the second section, by closing the mold and by applying pressure to the ceramic compound powder, such that the ceramic compound powder compacts around the second section of the thermocouple. The compacted ceramic compound powder by the embedding and molding should be formed to be stable for a predetermined time after the compressing and molding in order to allow application of the second layer.

In the method for manufacturing the thermocouple, due to the high temperature stability of the ceramic compounds, particularly magnesium oxides, at least a part of the second section coated by the first layer is then embedded in the second material by immersing at least a part of the coated second section, e.g., the coated embedded measuring junction, in a melt of the second material, e.g., in a melt of an alloy of at least one of gold, copper, and aluminum. When the second material solidifies, it safely encloses the first material compacted ceramic powder.

According to a third aspect of the present invention, a method for bonding the thermocouple to the target surface is provided. The target surface is part of at least one battery cell or a battery cell case of a battery module, and the method for bonding the thermocouple to the target surface is integrated in a method for manufacturing the battery module. The method for bonding the thermocouple to the target surface includes: inserting at least one thermocouple into a magazine of the wire-bonding apparatus; loading one thermocouple from the magazine into the capillary tool of the wire-bonding apparatus; applying downward pressure and ultrasonic energy to the embedded second section of the thermocouple via the capillary tool; and welding the second material of the embedded second section to the target surface.

In the method for bonding the thermocouple to the target surface, the wire-bonding apparatus may be a wire-bonding apparatus at it is commercially available for microelectronic applications, e.g., for providing wire connections between a chip pad and a lead frame. The commercially available wire-bonding apparatus is configured for producing a ball-bond and/or a wedge-bond between a wire segment and a target surface. With minor modifications of the commercially available wire-bonding apparatus, the wire-bonding apparatus is configured for producing a ball-bond and/or a wedge bond between the thermocouple and the target surface. The minor modifications refer at least to the replacement of a wire coil with a magazine configured for hosting at least one thermocouple, and the adaptation of a capillary tool of the wire-bonding apparatus to the overall diameter of such thermocouple.

In the method for bonding the thermocouple to the target surface, the wire-bonding apparatus is equipped with the thermocouple by providing the magazine. From the magazine, a single thermocouple is loaded to the capillary tool of the wire-bonding apparatus. The capillary tool is then positioned on the target surface, and the thermocouple is guided through the capillary tool such that a tip of the second section, i.e., the embedded measuring junction, is aligned with an opening of the capillary tool. The thermocouple is fixed in the capillary tool and the aligned embedded measuring junction is put on the target surface. Subsequently, downward pressure is exerted on the fixed thermocouple via the capillary tool, and ultrasonic energy is applied to the thermocouple via an ultrasonic transducer. Thus, the second material coating the second section is ultrasonic welded to the target surface. Hence, a reliable and long term stable mechanical connection having defined thermal properties is produced between the thermocouple and the target surface.

The method for bonding the thermocouple to the target surface may further include the step of at least partially fusing the second material of the aligned embedded second section by applying heat or an electric arc thereto before applying downward pressure and ultrasonic energy to the thermocouple. Due to this step, the second material is at least partially melted before putting the embedded measuring junction on the target surface, such that a ball of fused second material forms at the tip of the second section. Subsequently, this ball of fused second material is put on the target surface to form a ball-bond. The capillary tool can be freely moved in any direction after producing the ball-bond and hence alignment of the capillary tool is simplified.

The method for bonding the thermocouple to the target surface may further include welding the second end of the first wire and the second end of the second wire to respective contact pads on a circuit carrier, e.g., on a cell supervision circuit carrier. The step of welding the second end of the first wire and the second end of the second wire to respective contact pads may include: after producing the bond between the embedded second section (the embedded measuring junction) and the target surface, releasing the fixing of the thermocouple in the capillary tool; moving the capillary tool to the position of the respective contact pad; and guiding the thermocouple through the capillary tool. The first and second wires of the thermocouple may have different lengths from each other. In the welding of the second end of the first wire and the second end of the second wire to respective contact pads, if the capillary tool arrives at the position of a first contact pad, the second end of one of the first and second wires is positioned in the opening of the capillary tool, and if the capillary tool arrives at the position of a second contact pad, the second end of the other one of the first and second wires is positioned in the opening. Hence, both of the second ends of the first and second wires constituting the thermocouple can be bonded to a respective contact pad via the wire-bonding apparatus without risk of electrically shorting the wires.

According to a fourth aspect of the present invention, the wire-bonding apparatus for bonding the thermocouple to the target surface is provided. The wire-bonding apparatus may include the magazine configured for accommodating at least one thermocouple, and the capillary tool configured for loading the thermocouple and for applying downward pressure and ultrasonic energy to the embedded second section of the loaded thermocouple, wherein an inner diameter of the capillary tool is adapted to an outer diameter of the thermocouple.

The capillary tool may include a capillary configured for guiding the thermocouple and at least one element configured for fixing the thermocouple in the capillary in order to exert downward pressure on the thermocouple. The wire-bonding apparatus may further include at least one element configured for guiding a thermocouple from the magazine into and through the capillary, and at least one element configured for moving and positioning the capillary tool and at least one ultrasonic transducer. The capillary tool may further include at least one element for exerting heat or an electric arc to the opening region of the capillary tool and a thermocouple positioned therein.

According to a fifth aspect of the present invention, a battery module including a plurality of stacked battery cells that are electrically interconnected in series and/or in parallel between a negative module terminal and a positive module terminal via a plurality of busbars is provided. The battery module further includes a cell supervision circuit (CSC) carrier that is arranged on top of the plurality of stacked battery cells and that includes at least one first contact pad and at least one second contact pad. The battery module further includes at least one thermocouple, wherein the second material of the embedded second section of the at least one thermocouple is welded to a top surface of the battery cell, and wherein a free end of the first wire is welded to a first contact pad and a free end of the second wire is welded to a second contact pad. The CSC carrier includes at least one cell supervision circuit that is electrically connected to the first and second contact pads and is configured for receiving and processing signals related to the temperatures detected via the thermocouple and voltages of the battery cells.

Advantageous Effects

According to an embodiment of the present invention, it is possible to provide an improved thermocouple and a bonding method for such improved thermocouple that can be used on an industrial scale and allows for a long-term stable connection to a target surface even under prolonged vibrations and impacts.

DESCRIPTION OF THE DRAWINGS

FIG. 2(A) to (C) schematically illustrate a modification of a basic thermocouple according to an embodiment.

FIG. 3 schematically illustrates a cross-section of a second section of a thermocouple according to an embodiment.

FIGS. 4(A) and (B) schematically illustrate an example of a method for producing a thermocouple according to an embodiment from a basic thermocouple.

FIGS. 5(A) and (B) schematically illustrate another example of a method for producing a thermocouple according to an embodiment from a basic thermocouple.

FIGS. 6(A) to (C) schematically illustrate the bonding of a thermocouple according to an embodiment to a target surface using a capillary tool.

FIG. 7 schematically illustrates a battery module according to an embodiment.

MODE FOR INVENTION

Figure 1:
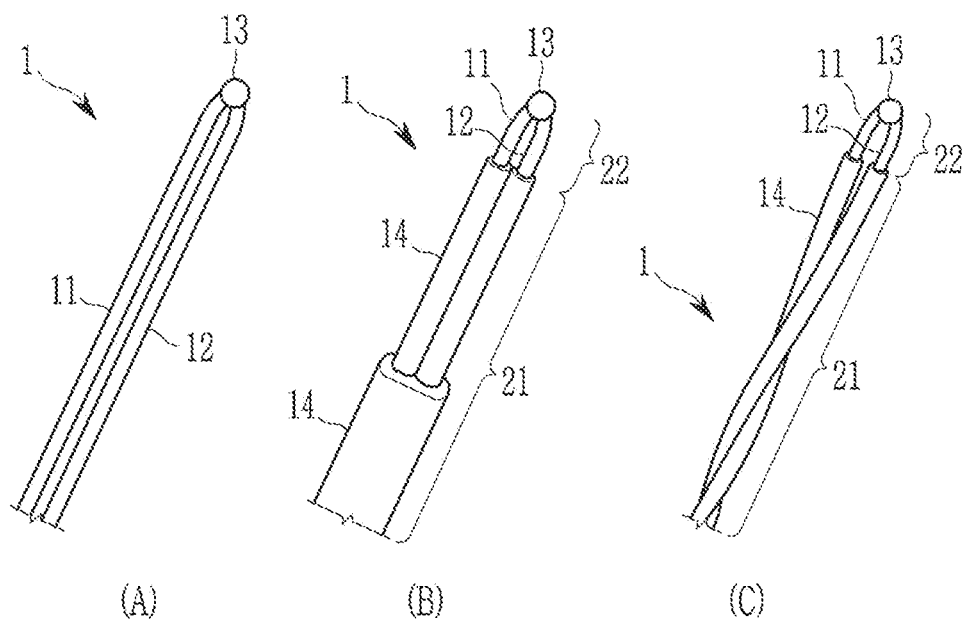
FIG. 1(A) to (C) schematically illustrate basic thermocouples according to the prior art.
Figure 1:
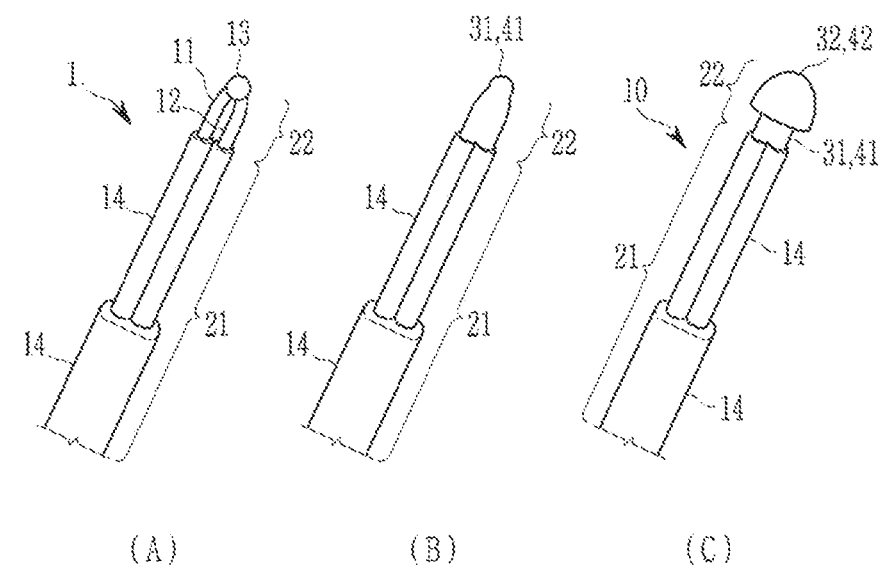

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Unless otherwise noted, like reference numerals denote like elements throughout the attached drawings and the written description, and thus, descriptions thereof will not be repeated. In the drawings, the relative sizes of features may be exaggerated for clarity.

It will be understood that although the terms including ordinal numbers such as "first", "second", and "third" are used to describe various elements, these elements should not be limited by these terms. These terms are only used to distinguish one element from another element. For example, a first element may be called a second element, and similarly, a second element may be called a first element, without departing from the scope of the present invention. The term "and/or" includes a combination of a plurality of related described elements, or any one of a plurality of related described elements.

Spatially relative terms, such as "beneath," "below," "lower," "under," "above," "upper," and the like, may be used herein for ease of explanation to describe one element or feature's relationship to another element(s) or feature(s) as illustrated in the FIGS. It will be understood that the spatially relative terms are intended to encompass different orientations of the device in use or in operation, in addition to the orientations depicted in the FIGS.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms (including technical and scientific terms) used herein have the same meaning as commonly understood by one of ordinary skill in the art to which the present invention belongs. It will be further understood that terms should be interpreted as having a meaning that is consistent with their meaning in the context of the relevant art and/or the present specification, and should not be interpreted in an idealized or overly formal sense.

FIG. 1(A) to (C) show basic thermocouples 1 according to the prior art that are commercially available particularly for scientific purposes or prototype construction. These basic thermocouples 1 include a first wire 11 and a second wire 12 that are bead welded to each other to form a measuring junction 13. The basic thermocouples 1 are configured to bend elastically, i.e. they are not rigid, across their whole length. Further, the basic thermocouples 1 include a first section 21 in which the first wire 11 and the second wire 12 are electrically insulated from each other by being surrounded by at least one plastic cable insulation material 14. The basic thermocouples 1 further includes a second section 22, wherein the measuring junction 13 is formed and wherein the wires 11 and 12 are exposed, i.e., not insulated.

FIG. 2(A) to (C) show stages in a method for producing a thermocouple 10 according to an embodiment of the invention from a basic thermocouple 1. FIG. 2(A) shows the basic thermocouple 1 of FIG. 1(B), and FIG. 2(C) shows a thermocouple 10 according to the embodiment of the invention. The second section 22 of the basic thermocouple 1 of FIG. 2(A) is initially coated with a first layer 31 of a first material 41. The first material 41 is thermally conductive and electrically insulating. Then, the first layer 31 of the first material 41 is partially coated with a second layer 32 of a second material 42 that is ultrasonic weldable to a target surface.

FIG. 3 shows a cross-section of the second section 22 of the thermocouple 10 shown in FIG. 2(C). In the second section 22, the measuring junction 13 of the first wire 11 and the second wire 12 is embedded (coated) by a first layer 31 of a first material 41 that electrically insulates the measuring junction 13 but does not impede heat flux to and from the measuring junction 13. The first material 41 may be polyimide, and the first layer may have a thickness of 1 mm around the bead-shaped measuring junction 13. The first layer 31 is partially embedded (coated) by a second layer 32 of a second material 42. At least the tip, i.e., the measuring junction 13 embedded by the first layer, is coated by the second layer 32 of the second material 42. The second material 42 is aluminum, and the second layer 32 may have a thickness of 100 µm. The thermocouple 10 as illustrated in FIG. 3 can be advantageously bonded to a target surface using a wire-bonding apparatus.

FIG. 4 schematically illustrates an example of a method for producing a thermocouple 10 of the invention. In step (A) of FIG. 4, a basic thermocouple 1 as described above is provided. In the first step (A) of the illustrated method of FIG. 4, the second section 22 of the basic thermocouple 1 is immersed in a solution 51 of the first material, particularly in a solution of polyimide in dimethylformamide (DMF), N-methyl pyrrolidone (NMP), or N-ethyl pyrrolidone (NEP) as a solvent. A first layer 31 of polyimide as the first material 41 is thus dip coated onto the second section 22 of the basic thermocouple 1. In the illustrated method, after the solvent has evaporated and the polyimide coating is cured, the method proceeds with a second step (B). Therein, a thin aluminum foil 52 is provided with a thickness of 100 µm and a one-side surface area that is essentially equal to 50% of the surface area of the second section 22 coated with the first material 41. As indicated by the downward arrow in the step (B) of FIG. 4, the thermocouple 10 is moved such that the second section 22 is driven into the thin foil 52 which thus wraps around the tip of the second section 22 in a manner comparable to deep drawing. Hence, a thermocouple 10 as illustrated in FIG. 3 results from step (B) of FIG. 4. Additionally, heat curing may be performed to intensify the bonding of the second material 42 to the first layer 31 of the first material 41.

FIG. 5 schematically illustrates another example of a method for producing a thermocouple 10 of the invention. Therein, in step (A) of FIG. 5, a basic thermocouple 1 as described above is provided. In the first step (A) of the illustrated method of FIG. 5, a ground magnesium oxide powder 53 is provided into a compression mold 61. The magnesium oxide powder 53 may be mainly applied to the walls of the mold 61. As indicated by the downward arrow in the step (A) of FIG. 5, the second section 22 of the basic thermocouple 1 is inserted into the mold 61 such that it is uniformly surrounded by the powder 53 attached to the walls of the mold 61. As indicated by the pair of horizontal arrows in the step (A) of FIG. 5(A), the mold 61 is then closed such that pressure is exerted on the magnesium oxide powder 53. The powder 53 is thus compacted and solidified around the second section 22 of the basic thermocouple 1. A first layer 31 of magnesium oxide as the first material 41 is thus formed around the second section 22.

Subsequently, in the step (B) of the method illustrated in FIG. 5, the tip of the second section 22 coated with the first layer 31 is immersed in an aluminum melt 54 for dip coating a second layer 32 of aluminum as the second material 42 on at least a part of the first layer 31. Hence, a thermocouple 10 as illustrated in FIG. 3 is produced in the step (B) of FIG. 5.

FIG. 6 schematically illustrates the bonding of a thermocouple 10 according to an embodiment to a target surface 15 using a modified capillary tool 62. In a first step (A) of the method illustrated in FIG. 6, a thermocouple 10 of the invention is loaded from a magazine (not shown) of a wire-bonding apparatus (not shown) hosting a plurality of thermocouples 10 into a capillary tool 62 by at least one element for guiding and transporting the thermocouple 10. The capillary tool 62 includes a capillary wherein the thermocouple is positioned and aligned such that the second section 22 of the thermocouple protrudes from an opening of the capillary tool 62. The capillary tool 62 is positioned above a target surface (not shown) at a predetermined position for establishing a weld connection between the thermocouple 10 and the target surface (not shown).

In a second step (B) of the method illustrated in FIG. 6, heat is applied to the second section 22 of the thermocouple 10 by applying an electric arc (not shown) to the second section 22. This fuses at least parts of the second material 42 forming the second layer 32 of the thermocouple 10, so that a ball of melted second material 42 forms at the tip of the second section 22.

In a third step (C) of the method illustrated in FIG. 6, the thermocouple 10 is fixed in the capillary tool 62 by constricting at least a part of the capillary tool 62. The capillary tool 62 with the fixed thermocouple 10 is then lowered onto the target surface 15 as indicated by the downward facing arrows in FIG. 6 (C). By further moving the capillary tool 62 towards the target surface 15, a downward pressure is exerted on the second material 42. Simultaneously, ultrasonic energy is applied to the capillary tool 62 and the thermocouple 10 via an ultrasonic transducer (not shown) as indicated by the arrows facing sideways. By the combination of downward pressure and ultrasonic energy, the at least partially fused second material 42 forms a weld connection with the target surface 15.

A thermocouple 10 according to an embodiment of the invention as illustrated in FIG. 3 may be produced from a basic thermocouple 1 in a method as schematically illustrated in FIGS. 4 and 5, and may be bonded to a target surface in a bonding method using a wire-bonding apparatus as illustrated in FIG. 6. Hence, the welded mechanical connection between the second material 42 and the target surface 15 is well defined and highly replicable. Thus, a temperature measurement by the thermocouple 10 can obtain the temperature at the thermal interface of the welding area between the second material 42 and the target surface 15 in a highly reproducible and reliable manner.

Referring to FIG. 7, an embodiment of a battery module 70 according to an embodiment of the invention includes a plurality of battery cells 71 aligned in one direction. Each battery cell 71 is a prismatic (or rectangular) cell, the wide flat surfaces of which are stacked together to form the battery module 70. Each battery cell 10 includes a battery case configured for accommodation of an electrode assembly and an electrolyte. The battery cells 71 are provided with positive and negative electrode terminals having different polarities. The positive and negative electrode terminals of neighboring battery cells 71 are electrically connected through busbars 74 such that a series connection of the battery cells 71 between a negative module terminal 72 and a positive module terminal 73 results. Hence, the battery module 70 can be used as power source by connecting the plurality of battery cells 71 as one bundle.

In FIG. 7, the battery module 70 and a cell supervision circuit (CSC) carrier 75 arranged on top of the battery cells 71 are illustrated in a top view. The CSC carrier 75 is arranged at a distance from the battery cells 71 and the busbars 74, and is positioned apart from the battery cells 71 by spacers (not shown). The CSC carrier 75 includes three cell supervision circuits 78, which are microprocessors or ASICs that are configured to receive and process signals related to the temperature and the voltage of one or more battery cells 71. The CSC carrier 75 further includes three pairs of contact pads, each pair including a first contact pad 76 and a second contact pad 77 made of electronic nickel immersion gold (ENIG). The contact pads 76 and 77 are connected to a respective one of the CSCs 78. Further, the busbars 74 are connected to the CSCs 78 via respective voltage sensing elements 79 in order to provide signals related to the voltages of the battery cells 71 to the CSCs 78.

The battery module 70 of FIG. 7 further includes three thermocouples 10 according to an embodiment of the invention. Therein, the second section (not shown) of each thermocouple 10 is welded to a top surface of a battery cell 71 via the second material 42 as described in more detail above. In this embodiment, first ends of the first and second wires (not shown) of the thermocouples 10 are connected in a measuring junction (not shown) embedded in the second material 42. The free second ends of the first and second wires are connected to a first contact pad 76 and a second contact pad 77, respectively. Herein, the bonds between the respective second ends of the wires and the contact pads 76 and 77 are formed by the wire-bonding apparatus described above. The bond between the respective second ends and the contact pads 76 and 77 is one of a ball bond and a wedge bond.

After producing the weld as illustrated in FIG. 6, to form a bond between each second end of the wires of the thermocouple 10 and contact pads 76 and 77, the wire-bonding apparatus reverse the constriction of the capillary tool 62 so that the thermocouple 10 is released in the capillary. Then, the capillary tool 62 is moved towards the first contact pad 76 while the thermocouple 10 is guided through the capillary. At the position of the first contact pad 76, the free second end of the first wire is positioned in the opening of the capillary tool 62, and then, in a state where the first wire is fixed in the capillary tool 62 by compression, a ball or wedge bond is produced between the second end of the first wire and the first contact pad 76 by constriction and by applying downward pressure and ultrasonic energy to the fixed first wire. After the first bond is produced, the capillary tool 62 reverses the constriction of the capillary tool 62 and then is moved to the second contact pad 77, while the second wire of the thermocouple 10 is guided through the capillary. At the position of the second contact pad 77, the free end of the second wire is positioned in the opening of the capillary tool 62, and then, in a state where the second wire is fixed in the capillary tool 62 by compression, a ball or wedge bond is produced between the second end of the second wire and the second contact pad 77 by constriction and by applying downward pressure and ultrasonic energy to the second wire. Herein, the second wire of the thermocouple 10 may be formed to have a longer length than the first wire.

The thermocouples 10 provide a temperature dependent voltage signal to the first and second contact pads 76 and 77, respectively. From there, these signals are transmitted to a respective CSC 78 that determines a temperature at the contact area between the second material 42 of the respective thermocouple 10 and the respective battery cell 71 from a current related to a voltage difference between the second ends of the first and second wire of the thermocouple 10.

The accompanying drawings and the exemplary embodiments of the present invention are only examples of the present invention, and are used to describe the present invention but do not limit the scope of the present invention as defined by the following claims. It will be understood by those of ordinary skill in the art that various modifications and equivalent embodiments may be made. Therefore, the technical scope of the present invention may be defined by the technical idea of the following claims.

DESCRIPTION OF SYMBOLS

| | | | |
|---|---|---|---|
| 1: | basic thermocouple | 10: | basic thermocouple |
| 11: | first wire | 12: | second wire |
| 13: | measuring junction | 14: | plastic cable insulation material |
| 15: | target surface | 21: | first section of thermocouple |
| 22: | second section of thermocouple | 23: | tip of thermocouple |
| 31: | first layer | 32: | second layer |
| 41: | first material | 42: | second material |
| 51: | melt or solution of the first material | 52: | thin foil |
| 53: | magnesium oxide powder | 54: | melt the second material |
| 61: | mold | 62: | capillary tool |
| 70: | battery module | 71: | battery cell |
| 72: | negative module terminal | 73: | positive module terminal |
| 74: | busbar | 75: | cell supervision circuit carrier |
| 76: | first contact pad | 77: | second contact pad |
| 78: | cell supervision circuit | 79: | voltage sensing element |

The invention claimed is:

1. A thermocouple for temperature measurement, comprising:
   a first wire of a first metallic material and a second wire of a second metallic material different from the first metallic material;
   a first section in which the first wire and the second wire are electrically insulated from each other;
   a second section in which the first wire and the second wire are connected to each other to form a measuring junction;
   a first layer of a thermally conductive and electrically insulating first material enclosing the second section; and
   a second layer of an ultrasonic-weldable second material enclosing at least part of the first layer.

2. The thermocouple of claim 1, wherein
   the first layer and the second layer are applied to surround the second section, and
   in the first section, at least one of the first wire and the second wire is enclosed by a plastic cable insulation material.

3. The thermocouple of claim 1, wherein
   a layer thickness of the first layer is 500 µm to 5 mm, and
   a layer thickness of the second layer is 50 µm to 1 mm.

4. The thermocouple of claim 1, wherein the first material is at least one of polyethylene, polyimide, polyamide, and magnesium oxide, and
   the first material comprises a thermally conductive filler.

5. The thermocouple of claim 1, wherein the second material comprises an alloy of at least one of gold, copper, and aluminum.

6. The thermocouple of claim 1, wherein the first wire and the second wire have different lengths.

7. A method for manufacturing a thermocouple for temperature measurement, the method comprising:
   providing a basic thermocouple including a first wire of a first metallic material and a second wire of a second metallic material different from the first metallic material, the thermocouple having a first section in which the first wire and the second wire are electrically insulated from each other and a second section in which the first wire and the second wire are connected to each other to form a measuring junction;
   enclosing the second section in a first layer of a thermally conductive and electrically insulating first material; and
   enclosing at least part of the first layer in a second layer of an ultrasonic-weldable second material.

8. The method of claim 7, wherein
the first material and the second material are applied to surround the second section, and
in the first section, at least one of the first wire and the second wire is enclosed by a plastic cable insulation material.

9. The method of claim 7, wherein
the first material is at least one of polyethylene, polyimide, and polyamide,
the enclosing of the second section in the first layer comprises immersing the second section in a melt or solution of the first material, and
the enclosing of at least part of the first layer in the second layer comprises wrapping a thin foil of the second material around a tip of the second section.

10. The method of claim 9, wherein the thin foil of the second material is provided at a thickness 50 μm to 1.

11. The method of claim 10, wherein the thin foil of the second material has a one-side surface area that is at least 50% of the surface area of the second section.

12. The method of claim 7, wherein
the first material is magnesium oxide,
the enclosing of the second section in the first layer comprises: inserting a magnesium oxide powder and the second section into a mold; and compressing and molding the magnesium oxide powder around the second section, and
the enclosing of at least part of the first layer in the second layer comprises immersing at least part of the second section enclosed by the first layer in a melt of an alloy of at least one of gold, copper, and aluminum as the second material.

13. A method for bonding a thermocouple to a target surface, the method comprising:
inserting at least one thermocouple into a magazine of a wire-bonding apparatus, the thermocouple including a first wire of a first metallic material and a second wire of a second metallic material different from the first metallic material, a first section in which the first wire and the second wire are electrically insulated from each other, a second section in which the first wire and the second wire are connected to each other to form a measuring junction, a first layer of a thermally conductive and electrically insulating first material enclosing the second section, and a second layer of an ultrasonic-weldable second material enclosing at least part of the first layer;
loading one thermocouple from the magazine into a capillary tool of the wire-bonding apparatus;
applying downward pressure and ultrasonic energy to the enclosed second section of the thermocouple via the capillary tool; and
welding the second material of the enclosed second section to the target surface.

14. The method of claim 13, further comprising at least partially fusing the second material of the enclosed second section by applying heat or an electric arc thereto before applying downward pressure and ultrasonic energy thereto.

15. A thermocouple and a wire-bonding apparatus for bonding the thermocouple to a target surface:
the thermocouple comprising a first wire of a first metallic material and a second wire of a second metallic material different from the first metallic material, a first section in which the first wire and the second wire are electrically insulated from each other, a second section in which the first wire and the second wire are connected to each other to form a measuring junction, a first layer of a thermally conductive and electrically insulating first material enclosing the second section, and a second layer of an ultrasonic-weldable second material enclosing at least part of the first layer to a target surface; and
the wire-bonding apparatus comprising:
a magazine configured for accommodating at least one of the thermocouples; and
a capillary tool configured for loading the thermocouple and for applying downward pressure and ultrasonic energy to the enclosed second section of the loaded thermocouple, an inner diameter of the capillary tool being adapted to an outer diameter of the thermocouple.

16. A battery module, comprising:
a plurality of stacked battery cells electrically interconnected in series and/or in parallel between a negative module terminal and a positive module terminal via a plurality of busbars;
a cell supervision circuit carrier arranged on top of the plurality of stacked battery cells and comprising at least one first contact pad and at least one second contact pad; and
at least one thermocouple,
wherein the thermocouple includes a first wire of a first metallic material and a second wire of a second metallic material different from the first metallic material, a first section in which the first wire and the second wire are electrically insulated from each other, a second section in which the first wire and the second wire are connected to each other to form a measuring junction, a first layer of a thermally conductive and electrically insulating first material enclosing the second section, and a second layer of an ultrasonic-weldable second material enclosing at least part of the first layer,
wherein the second material of the enclosed second section of one of the at least one thermocouple is welded to a top surface of one battery cell of the plurality of stacked battery cells, and
a free end of the first wire is welded to the first contact pad and a free end of the second wire is welded to the second contact pad.

* * * * *